United States Patent
Li et al.

(10) Patent No.: US 10,749,006 B2
(45) Date of Patent: Aug. 18, 2020

(54) TRENCH POWER TRANSISTOR AND METHOD OF PRODUCING THE SAME

(71) Applicant: Leadpower-semi CO., LTD., Zhubei (TW)

(72) Inventors: Po-Hsien Li, Taipei (TW); Jen-Hao Yeh, Zhubei (TW); Hsin-Yen Chiu, Taichung (TW)

(73) Assignee: LEADPOWER-SEMI CO., LTD., Zhubei (TW)

( * ) Notice: Subject to any disclaimer, the term of this patent is extended or adjusted under 35 U.S.C. 154(b) by 0 days.

(21) Appl. No.: 16/567,075

(22) Filed: Sep. 11, 2019

(65) Prior Publication Data
US 2020/0227526 A1 Jul. 16, 2020

(30) Foreign Application Priority Data
Jan. 11, 2019 (TW) .............................. 108101122 A (51) Int. Cl.
*H01L 29/78* (2006.01)
*H01L 29/417* (2006.01)
(Continued)

(52) U.S. Cl.
CPC .... *H01L 29/41741* (2013.01); *H01L 21/0217* (2013.01); *H01L 21/02164* (2013.01);
(Continued)

(58) Field of Classification Search
CPC ....... H01L 21/823487; H01L 29/66727; H01L 29/66719; H01L 29/66734
See application file for complete search history.

(56) References Cited

U.S. PATENT DOCUMENTS 8,497,549 B2 * 7/2013 Madson .............. H01L 29/7813
257/330
2008/0211654 A1 9/2008 Kasamatsu
(Continued)

FOREIGN PATENT DOCUMENTS

TW 200304681 A 10/2003
TW 200915437 A 4/2009

OTHER PUBLICATIONS

Search Report appended to an Office Action, which was issued to Taiwanese counterpart application No. 108101122 by the TIPO dated Aug. 30, 2019, with an English translation thereof.

*Primary Examiner* — George R Fourson, III
(74) *Attorney, Agent, or Firm* — Allen, Dyer, Doppelt + Gilchrist, PA (57) ABSTRACT

A trench power transistor includes a semiconductor body having opposite first and second surfaces, and including at least one active region. Such region includes a trench electrode structure, a well, and a source. The trench electrode structure has an electrode trench recessed from the first surface, and includes first, second, and third insulating layers sequentially disposed over bottom and surrounding walls of the electrode trench, a shield electrode enclosed by the third insulating layer, a fourth insulating layer disposed on the first, second, and third insulating layers, and a gate electrode surrounded by the fourth insulating layer. The second insulating layer made of a nitride material and the fourth insulating layer are different in material. A production method of the transistor is also disclosed.

17 Claims, 9 Drawing Sheets

(51) Int. Cl.
  *H01L 21/02* (2006.01)
  *H01L 29/40* (2006.01)
  *H01L 29/10* (2006.01)
  *H01L 29/66* (2006.01)
  *H01L 21/765* (2006.01)
  *H01L 21/3213* (2006.01)
  *H01L 21/311* (2006.01)
  *H01L 21/265* (2006.01)
  *H01L 21/285* (2006.01)
  *H01L 21/8234* (2006.01)

(52) U.S. Cl.
  CPC .. *H01L 21/02236* (2013.01); *H01L 21/02271* (2013.01); *H01L 21/26513* (2013.01); *H01L 21/28537* (2013.01); *H01L 21/31111* (2013.01); *H01L 21/32133* (2013.01); *H01L 21/765* (2013.01); *H01L 29/1095* (2013.01); *H01L 29/407* (2013.01); *H01L 29/66727* (2013.01); *H01L 29/66734* (2013.01); *H01L 29/7806* (2013.01); *H01L 29/7811* (2013.01); *H01L 29/7813* (2013.01); *H01L 21/823487* (2013.01); *H01L 29/66719* (2013.01)

(56) References Cited

U.S. PATENT DOCUMENTS

| | | | |
|---|---|---|---|
| 2010/0078718 A1* | 4/2010 | Blank | H01L 29/407 257/331 |
| 2011/0049618 A1* | 3/2011 | Lee | H01L 29/66734 257/330 |
| 2011/0136310 A1 | 6/2011 | Grivna | |
| 2012/0187474 A1* | 7/2012 | Rexer | H01L 29/66734 257/330 |
| 2012/0326227 A1* | 12/2012 | Burke | H01L 29/7811 257/330 |
| 2014/0273374 A1* | 9/2014 | Yedinak | H01L 29/7813 438/272 |
| 2017/0194486 A1* | 7/2017 | Venkatraman | H01L 29/66734 |
| 2017/0213906 A1* | 7/2017 | Li | H01L 29/4236 |

\* cited by examiner

FIG.9

TRENCH POWER TRANSISTOR AND METHOD OF PRODUCING THE SAME

CROSS-REFERENCE TO RELATED APPLICATION

This application claims priority of Taiwanese Patent Application No. 108101122, filed on Jan. 11, 2019.

FIELD

The disclosure relates to a power transistor and a production method thereof, and more particularly to a trench power transistor and a production method thereof.

BACKGROUND

Power transistors can be applied to digital circuits and analog circuits, and hence are widely applicable power components. Power transistors can be categorized into horizontal and vertical power transistors based on the current flow path. Common vertical power transistors include trench gate metal-oxide-semiconductor field-effect transistors (trench gate MOSFETs or UMOSFETs), V-groove MOSFETs (VMOSFETs), and vertical double-diffused MOSFETs (VDMOSFETs). Further, since the U-shaped trench of trench gate MOSFETs can effectively reduce the on-state resistance and improve the edge termination characteristics of transistors, trench gate MOSFETs may serve as promising high-frequency low-voltage power components.

However, conventional trench power transistors such as trench gate MOSFETs, when operated in the blocking mode, are required to support all the forward blocking voltage across the drift region (e.g. an N-type drift layer). Therefore, in order to support a higher forward blocking voltage, it is necessary to reduce the doping concentration in the drift region. As a trade-off for such reduction, the on-state resistance is increased, which is unfavorable to the component characteristics. In addition, since the gate electrode in the trench of conventional trench power transistors is unsatisfactorily large in volume, the gate-to-drain capacitance ($C_{GD}$) is unsatisfactorily large, and the operation of conventional trench power transistors at high frequency is limited.

Figure 1:
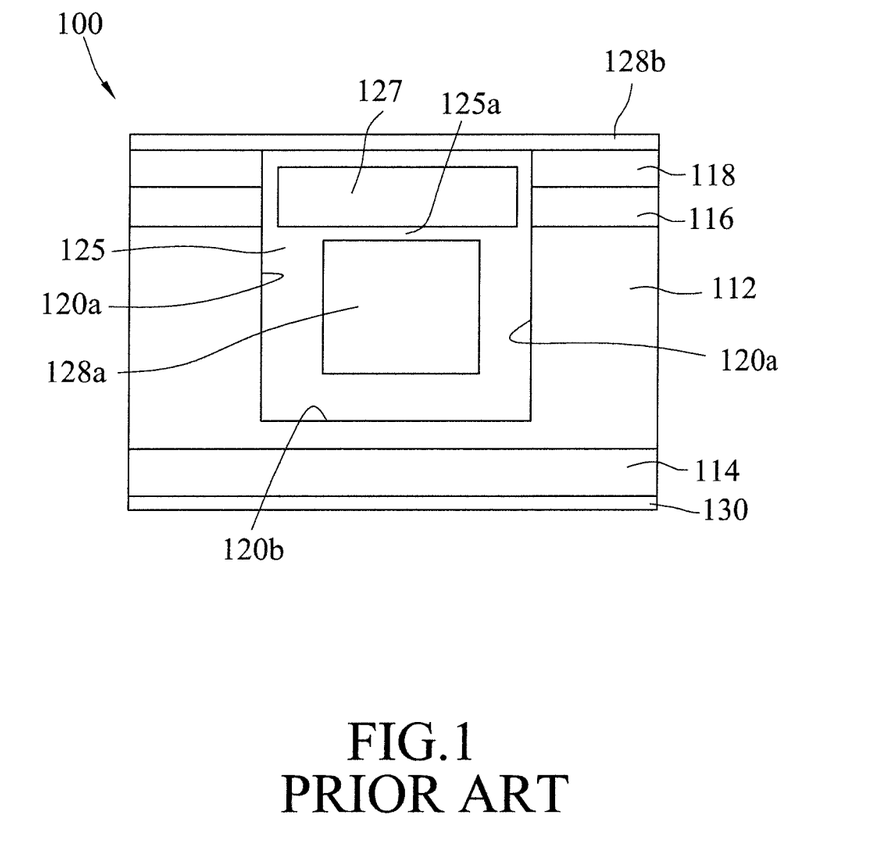
FIG. 1 is a schematic sectional view of a conventional trench power transistor.

Referring to FIG. 1, a conventional trench power transistor having improved high frequency switching and breakdown characteristics, as disclosed in U.S. Pat. No. 5,998,833, is illustrated. Each unit cell 100 of the trench power transistor includes a first-type doped drain layer 114 that has a high doping concentration (e.g. N⁺ doping), a first-type doped drift layer 112, a second-type doped (e.g. P-type doped) base layer 116 that is formed on the drift layer 112, a source layer 118 that has a high doping concentration, a source electrode 128b and a drain electrode 130 that are in ohmic contact respectively with the source layer 118 and the drain layer 114, and a trench electrode structure. The trench electrode structure has a trench that is defined by two opposing sidewalls 120a and a bottom 120b. The trench electrode structure includes a gate electrode 127, a trench-based source electrode 128a, and an oxide insulating layer 125 that has an insulating region 125a disposed between the gate electrode 127 and the trench-based source electrode 128a. Basically, the trench-based source electrode 128a is used to replace a part of the gate electrode 127 to reduce the $C_{SD}$ for decreasing the interference current and gate charge generated during the operation of the trench power transistor at high frequency, so that the breakdown voltage and the switching speed of the trench power transistor at high frequency can be improved without sacrificing the on-state resistance. However, the aforesaid intended effects are still unsatisfactory.

SUMMARY

Therefore, an object of the disclosure is to provide a trench power transistor and a production method thereof that can alleviate at least one of the drawbacks of the prior art.

The trench power transistor includes a semiconductor body that has a first surface and a second surface opposite to each other, and that includes at least one active region. The active region includes a trench electrode structure, a well, and a source. The trench electrode structure has an electrode trench that is recessed from the first surface, and that has a bottom wall and a surrounding wall extending downwardly from the first surface to the bottom wall. The electrode trench has a lower portion that is defined by the bottom wall and a lower part of the surrounding wall extending upwardly from the bottom wall, and an upper portion that is defined by an upper part of the surrounding wall extending upwardly from the lower part of the surrounding wall to the first surface. The trench electrode structure includes a first insulating layer, a second insulating layer, a third insulating layer, a shield electrode, a fourth insulating layer, and a gate electrode. The first insulating layer is disposed over the bottom wall and the upper and lower parts of the surrounding wall, and has a first upper end proximal to the first surface. The second insulating layer is disposed over a lower part of the first insulating layer overlaying the bottom wall and the lower part of the surrounding wall, has a second upper end proximal to the upper portion of the electrode trench, and is made of a nitride material. The third insulating layer is disposed over the second insulating layer, has a third upper end proximal to the upper portion of the electrode trench, and is made of a material different from that of the second insulating layer. The shield electrode is enclosed by the third insulating layer. The fourth insulating layer is made of a material different from that of the second insulating layer, is disposed in the upper portion of the electrode trench, and is disposed on the third upper end of the third insulating layer, the second upper end of the second insulating layer, and a top part of the first insulating layer overlaying the upper part of the surrounding wall. The gate electrode is disposed on and surrounded by the fourth insulating layer. The well is formed adjacent to the electrode trench of the trench electrode structure, and extends downwardly from the first surface. The source is formed in the well.

The method for producing a trench power transistor includes steps (a) to (i) described below. In step (a), a semiconductor substrate is provided. The semiconductor substrate has a first surface and a second surface opposite to each other, and at least one electrode trench that is recessed from the first surface, and that has a bottom wall and a surrounding wall extending downwardly from the first surface to the bottom wall. In step (b), a first insulating material is deposited over the first surface and the bottom wall and the surrounding wall of the electrode trench, a nitride material is deposited over the first insulating material, and a second insulating material is deposited over the nitride material. The second insulating material is different in material from the nitride material. In step (c), a polycrystalline silicon material is disposed in the electrode trench to be surrounded by the second insulating material, and the second insulating material is partially etched so that the second insulating material is retained in the electrode trench. In step (d), the polycrystalline silicon material is partially etched, and a third insulating material is disposed to cover the nitride material, the second insulating material, and the polycrystalline silicon material. In step (e), the third insulating material is partially etched so that the nitride material is partially exposed, and so that a remaining portion of the third insulating material in the electrode trench has a predetermined thickness to cooperate with the second insulating material for enclosing the polycrystalline silicon material. In step (f), an exposed portion of the nitride material is etched so that a portion of the first insulating material covered by the exposed portion of the nitride material is exposed, and so that a remaining portion of the nitride material surrounds the remaining portion of the third insulating material and the second insulating material, In step (g), through a low-pressure chemical vapor deposition process conducted at a temperature ranging from 650° C. to 750° C., a fourth insulating material is disposed on an exposed portion of the first insulating material, and on the remaining portion of the third insulating material and the remaining portion of the nitride material in the electrode trench. The fourth insulating material is different in material from the nitride material. In step(h), another polycrystalline silicon material is disposed in the electrode trench and on a portion of the fourth insulating material that is not disposed on a portion of the first insulating material covering the first surface, and a portion of the fourth insulating material that is disposed on the portion of the first insulating material covering the first surface is etched. In step (i), through ion implantation, a well is formed adjacent to the electrode trench, and a source is formed in the well. The well extends downwardly from the first surface.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that like elements are denoted by the same reference numerals throughout the disclosure.

Figure 2:
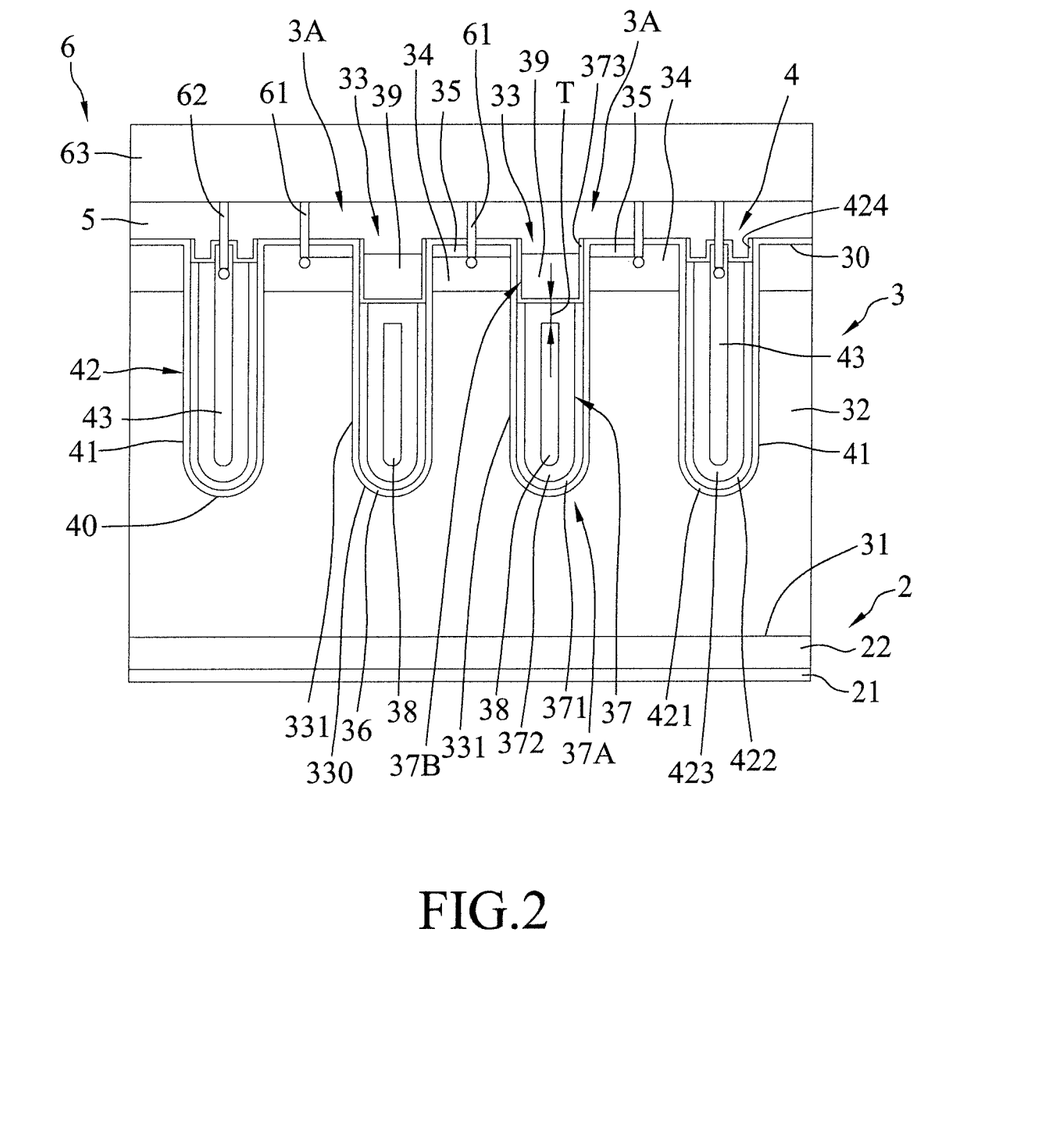
FIG. 2 is a schematic sectional view of a first embodiment of a trench power transistor according to the present disclosure.

Referring to FIG. 2, a first embodiment of a trench power transistor according to the present disclosure includes a substrate 2, a semiconductor body 3, an insulation layer 5, and an electrically conducting unit 6.

The semiconductor body 3 has a first surface 30 and a second surface 31 opposite to each other. The insulation layer 5 and the substrate 2 are respectively disposed on the first and second surfaces 30, 31 of the semiconductor body 3. The electrically conducting unit 6 is disposed on the insulation layer 5 opposite to the substrate 2.

The substrate 2 includes a drain electrode 21 and a first-type doped drain layer 22 that is disposed between the second surface 31 of the semiconductor body 3 and the drain electrode 21, that is in ohmic contact with the drain electrode 21, that is made of a semiconductor material, and that has a doping concentration at least higher than $10^{19}$ cm$^{-3}$.

The semiconductor body 3 (the second surface 31 of which is covered by the drain layer 22) includes a first-type doped drift zone 32 that extends upwardly from the second surface 31 to the first surface 30, and that has a doping concentration less than that of the drain layer 22, and at least one active region 3A that is formed in the drift zone 32. In this embodiment, the semiconductor body 3 includes two of the active regions 3A formed adjacent to each other.

The term "first-type doped" refers to being doped with a first conductivity type dopant, and the term "second-type doped" refers to being doped with a second conductivity type dopant that is opposite in conductivity type to the first conductivity type dopant. For instance, the first conductivity type dopant may be an n-type dopant, and the second conductivity type dopant may be a p-type dopant, and vice versa. The trench power transistor of the present disclosure may be used as an n-channel metal-oxide semiconductor (NMOS) transistor or a p-channel metal-oxide semiconductor (PMOS) transistor.

Each of the active regions 3A includes a trench electrode structure 33, a second-type doped well 34, and a first-type doped source 35. Each of the sources 35 has a doping concentration that is at least higher than $10^{19}$ cm$^{-3}$.

The trench electrode structure 33 has an electrode trench that is recessed from the first surface 30 to be formed in the drift zone 32, and that has a bottom wall 330 and a surrounding wall 331 extending downwardly from the first surface 30 to the bottom wall 330. The electrode trench has a lower portion that is defined by the bottom wall 330 and a lower part of the surrounding wall 331 extending upwardly from the bottom wall 330, and an upper portion that is defined by an upper part of the surrounding wall 331 extending upwardly from the lower part of the surrounding wall 331 to the first surface 31.

The trench electrode structure 33 includes a first insulating layer 36, a second insulating layer 371, a third insulating layer 372, a shield electrode 38, a fourth insulating layer 373, and a gate electrode 39. The first insulating layer 36 is disposed over the bottom wall 330 and the upper and lower parts of the surrounding wall 331, and has a first upper end that is proximal to the first surface 30. The second insulating layer 371 is disposed over a lower part of the first insulating layer 36 that overlays the bottom wall 330 and the lower part of the surrounding wall 331 (i.e. the second insulating layer 371 is disposed in the lower portion of the electrode trench), has a second upper end proximal to the upper portion of the electrode trench, and is made of a nitride material. The third insulating layer 372 is disposed over the second insulating layer 371 (i.e. the third insulating layer 372 is disposed in the lower portion of the electrode trench), has a third upper end proximal to the upper portion of the electrode trench, and is made of a material different from that of the second insulating layer 371. The shield electrode 38 is enclosed by the third insulating layer 372 (i.e. the shield electrode 38 is disposed in the lower portion of the electrode trench). The fourth insulating layer 373 is made of a material different from that of the second insulating layer 371, is disposed in the upper portion of the electrode trench, and is disposed on the third upper end of the third insulating layer 372, the second upper end of the second insulating layer 371, and a top part of the first insulating layer 36 that overlays the upper part of the surrounding wall 331. The gate electrode 39 is disposed on and surrounded by the fourth insulating layer 373 (i.e. the gate electrode 39 is disposed in the upper portion of the electrode trench), and has a top face that is covered by the insulation layer 5.

The second, third, and fourth insulating layers 371, 372, 373 cooperate to define an insulating area 37. Specifically, the second and third insulating layers 371, 372 together define a lower insulating portion 37A of the insulating area 37 where the shield electrode 38 is placed, and the fourth insulating layer 373 defines an upper insulating portion 37B of the insulating area 37 where the gate electrode 39 is placed.

The second insulating layer 371 is able to protect the first insulating layer 36 against oxidation growth. In this embodiment, the second insulating layer 371 is made of silicon nitride.

The first, third and fourth insulating layers 36, 372, 373 each may be made of an oxide material. In this embodiment, the first and third insulating layers 36, 372 are each made of a silicon oxide material, and the fourth insulating layer 373 is made of a silicon dioxide material.

It should be noted that even though the first and third insulating layers 36, 372 are each made of a silicon oxide material, these two insulating layers may be formed using different processes. For example, the first insulating layer 36 may be formed through thermal oxidation to have a dense structure made of a silicon oxide material, and the third insulating layer 372 may be formed through chemical vapor deposition so as to control the total oxide thickness easily. Since the process of forming a film layer is known in the art, detailed description thereof is omitted herein for the sake of brevity.

The third insulating layer 372 has a thickness (T) that is equal to a distance between an upper end of the shield electrode 38 proximal to the upper portion of the electrode trench and a lower portion of the fourth insulating layer 373 overlaying the third upper end of the third insulating layer 372. The thickness (T) ranges from 2000 Å to 4000 Å.

The fourth insulating layer 373 may be formed through a low-pressure chemical vapor deposition process conducted at a temperature ranging from 650° C. to 750° C. The fourth insulating layer 373 may have a thickness ranging from 100 Å to 500 Å.

Each of the wells 34 is formed adjacent to the upper portion of the electrode trench of the corresponding one of the trench electrode structures 33, and extends downwardly from the first surface 30.

Each of the sources 35 is formed in a corresponding one of the wells 34.

The semiconductor body 3 further includes a trench edge termination structure 4 that surrounds the active regions 3A. It should be noted that even though two sectional representations of the trench edge termination structure 4 are shown in FIG. 2, they together represent the trench edge termination structure 4 which is in an annular form (e.g. a circular form, a quadrilateral form, or other loop form) for surrounding the active regions 3A.

The trench edge termination structure 4 has a termination trench that is recessed from the first surface 30, and that has a bottom wall 40 and a surrounding wall 41 extending downwardly from the first surface 30 to the bottom wall 40 (please note that two sectional representations of the termination trench in an annular form are shown in FIG. 2). The trench edge termination structure 4 includes a first insulator layer 421, a second insulator layer 422, a third insulator layer 423, a fourth insulator layer 424, and an electrically conductive member 43. The first insulator layer 421 is disposed over the bottom wall 40 and the surrounding wall 41 of the termination trench, and has a first lower end formed over the bottom wall 40 of the termination trench. The second insulator layer 422 is disposed over the first insulator layer 421, and has a second lower end formed over the first lower end of the first insulator layer 421. The third insulator layer 423 is disposed over the second insulator layer 422, and has a third lower end formed over the second lower end of the second insulator layer 422. The electrically conductive member 43 is surrounded by the third insulator layer 423, extends upwardly from the third lower end of the third insulator layer 423, and has a height not less than half of a depth of the termination trench. The fourth insulator layer 424 is disposed over a first upper end of the first insulator layer 421 proximal to the first surface 30, a second upper end of the second insulator layer 422 proximal to the first surface 30, a third upper end of the third insulator layer 423 proximal to the first surface 30, and a top part of the electrically conductive member 43 proximal to said first surface 30.

The second insulator layer 422 is made of a material that is able to protect the first insulator layer 421 against oxidation growth. The first and third insulator layers 421, 423 may be made of the same material or different materials, and are each made of a material which is different from that of the second insulator layer 422. The first and third insulator layers 421, 423 each may be made of an oxide material, and the second insulator layer 422 may be made of a nitride material. In this embodiment, the first and third insulator layers 421, 423 each are made of a silicon oxide material, and the second insulator layer 422 is made of a silicon nitride material.

It should be noted that even though the first and third insulator layers 421, 423 are each made of a silicon oxide material, these two insulator layers may be formed using different processes. For example, the first insulator layer 421 may be formed through thermal oxidation to have a dense structure made of a silicon oxide material, and the third insulator layer 423 may be formed through chemical vapor deposition so as to control the total oxide thickness easily. Since the process of forming a film layer is known in the art, the same is omitted herein for the sake of brevity.

The fourth insulator layer 424 may be made of an oxide material. In this embodiment, the fourth insulator layer 424 is made of a silicon dioxide material. The fourth insulator layer 424 may be formed through a low-pressure chemical vapor deposition process conducted at a temperature ranging from 650° C. to 750° C. The fourth insulator layer 424 may have a thickness ranging from 100 Å to 500 Å.

The insulation layer 5 covers the first surface 30, the electrode trenches, and the termination trench of the semiconductor body 3. The insulation layer 5 is made of an insulation oxide material having a thickness of around 6000 Å, for instance, phosphosilicate glass (PSG) and borophosphosilicate glass (BPSG).

The electrically conducting unit 6 provides external electrical connection for the active regions 3A and the trench edge termination structure 4 through a three-dimensional wiring structure. The electrically conducting unit 6 includes at least one source conducting plug 61, at least one gate electrode conducting plug (not shown), at least one edge termination conducting plug 62, and an electrically conducting layer 63. In this embodiment, three of the source conducting plugs 61, two of the gate electrode conducting plugs, and two of the edge termination conducting plugs 62 are provided. Each of the source conducting plugs 61 extends through the insulation layer 5 to be in ohmic contact with a corresponding one of the sources 35 of the active regions 3A. Each of the gate electrode conducting plugs is disposed to be in ohmic contact with a corresponding one of the gate electrodes 39 of the active regions 3A. Each of the edge termination conducting plugs 62 extends through the insulation layer 5 to be in ohmic contact with the electrically conductive member 43 of the trench edge termination structure 4. The electrically conducting layer 63 is formed on the insulation layer 5 opposite to the semiconductor body 3, and provides electrical connection for a respective one of the source conducting plugs 61, the gate electrode conducting plugs, and the edge termination conducting plugs 62.

The advantages of the trench power transistor of the present disclosure are described below.

Even though a nitride material (e.g. silicon nitride) can protect an oxide material (e.g. silicon oxide) during etching and thermal processes and prevent the same from being adversely affected (e.g. damaged) during these and subsequent processes so as to maintain the characteristics of the interface between the trench electrode structure and the drift zone, such nitride material might interact with the gate electrode of the trench electrode structure and hence adversely influence the property of the trench power transistor. Therefore, by virtue of the design that the gate electrode 39 is surrounded by the fourth insulating layer 373 which is disposed between the gate electrode 39 and the second insulating layer 371, the gate electrode 39 and the second insulating layer 371 made of a nitride material can be sufficiently separated, such that the gate electrode 39 can be prevented from contacting the second insulating layer 371. Since the gate electrode 39 and the second insulating layer 371 made of a nitride material can be prevented from interaction which might induce undesired generation of charges, the operation performance and reliability of the trench power transistor according to the present disclosure can be ensured.

Since the trench power transistor according to the present disclosure can have satisfactory voltage withstanding capability due to the aforesaid advantage, the doping concentration of the drift zone 32 can be enhanced to reduce the on-state resistance so as to decrease the power consumption during the operation of the trench power transistor.

Figure 9:
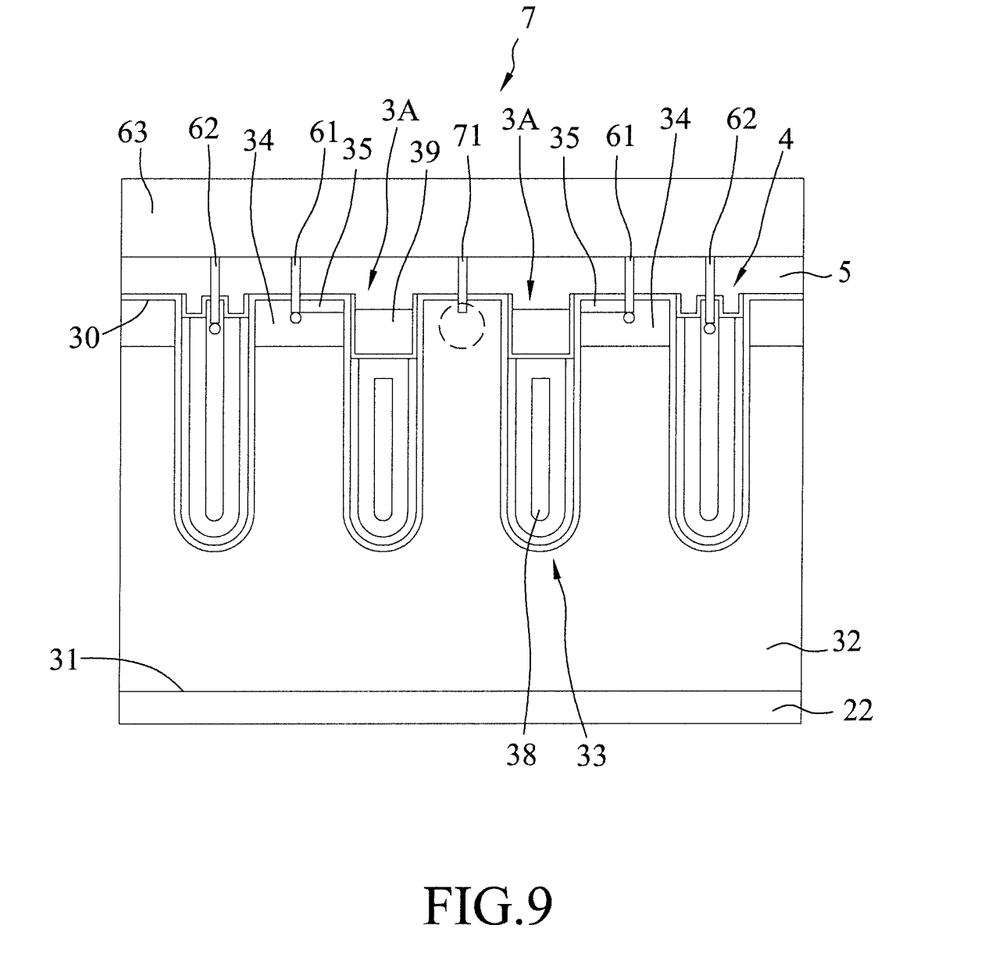
FIG. 9 is a schematic sectional view of a second embodiment of the trench power transistor according to the present disclosure.

Referring to FIG. 9, a second embodiment of the trench power transistor is similar to the first embodiment, except that the semiconductor body 3 further includes a rectifier structure 7 disposed between the two adjacent active regions 3A, and that the well 34 and the source 35 disposed between the two adjacent active regions 3A as shown in FIG. 2, as well as the source conducting plug 61 in ohmic contact with such source 35 as shown in FIG. 2, are replaced by the rectifier structure 7. It should be noted that the rectifier structure 7 may be integrated into the trench power transistor as illustrated in FIG. 9, or may be a trench MOS barrier Schottky rectifier (TMBS). The rectifier structure 7, for integration into the trench power transistor, includes a Schottky conductive plug 71 that is in Schottky contact with the drift zone 32 of the semiconductor body 3, and that is provided with external electrical connection by the electrically conducting layer 63. The rectifier structure 7 can reduce power consumption because of low forward voltage and also provide a fast recovery when switching off.

The present disclosure also provides a method for producing a trench power transistor. A first embodiment of the method, which is for producing the first embodiment of the trench power transistor, is illustrated in FIGS. 3 to 8. The first embodiment of the method comprises steps 91 to 99.

Figure 3:
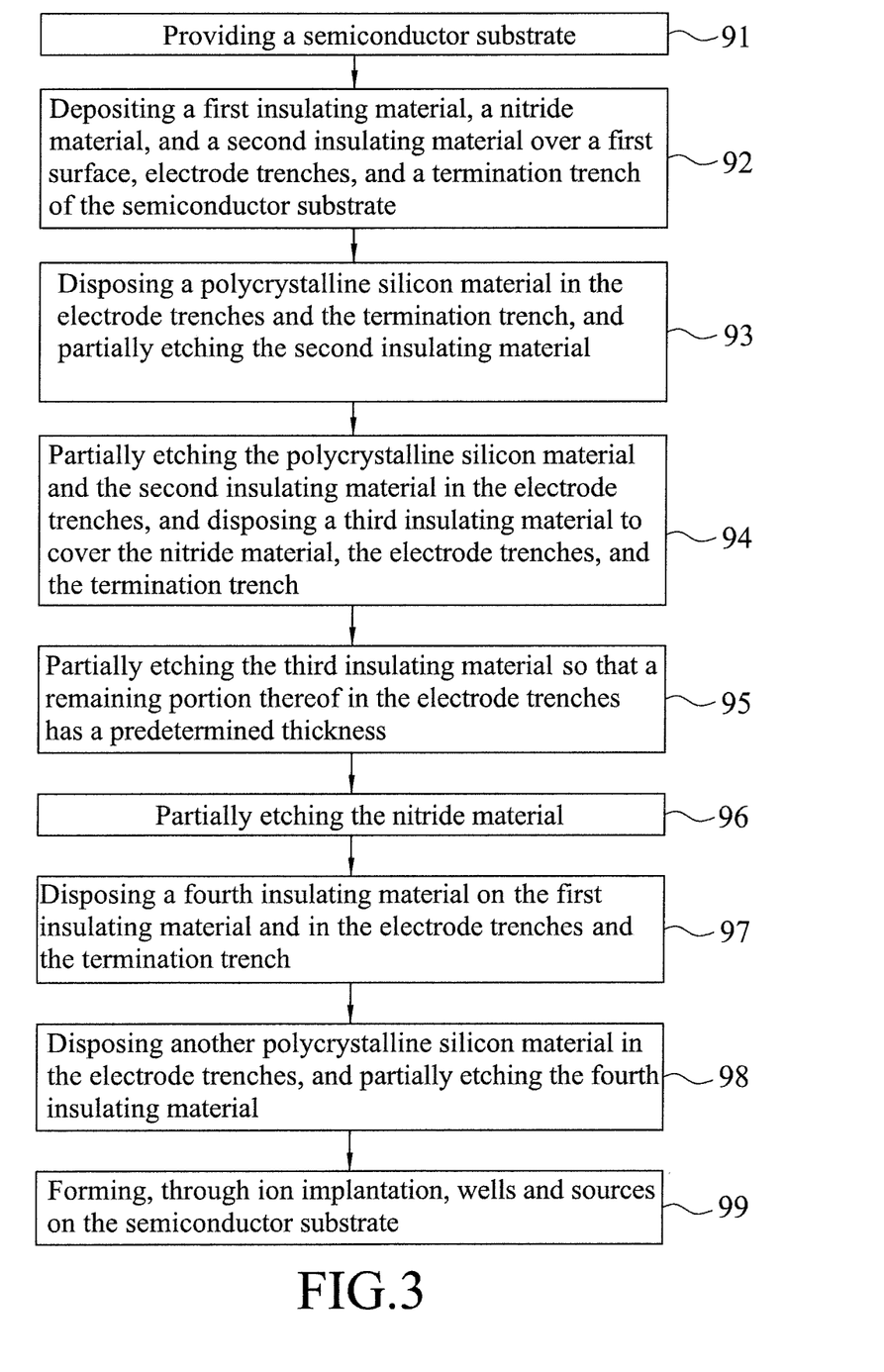
FIG. 3 is a flow chart illustrating an embodiment of a method for producing a trench power transistor according to the present disclosure.

In step 91, a semiconductor substrate is provided. The semiconductor substrate has the opposite first and second surfaces 30, 31, the two electrode trenches, the termination trench, and the drift zone 32 described above. The drain layer 22 described above is disposed on the second surface 31 of the semiconductor substrate. The drain layer 22 and the drift zone 32 are formed by virtue of a semiconductor epitaxial growth process and an ion implantation process. The electrode trenches and the termination trench are formed by virtue of an etching process.

In step 92, a first insulating material 201 is deposited over the first surface 30, the bottom wall 330 and the surrounding wall 331 of each of the electrode trenches, and the bottom wall 40 and the surrounding wall 41 of the termination trench, a nitride material 202 is deposited over the first insulating material 201, and a second insulating material 203 is deposited over the nitride material 202. Specifically, the first insulating material 201 is intended to form the first insulating layer 36 of each of the trench electrode structures 33 and the first insulator layer 421 of the trench edge termination structure 4, the nitride material 202 is intended to form the second insulating layer 371 of each of the trench electrode structures 33 and the second insulator layer 422 of the trench edge termination structure 4, and the second insulating material 203 is intended to form the third insulating layer 372 of each of the trench electrode structures 33 and the third insulator layer 423 of the trench edge termination structure 4. Therefore, in compliance with the description above, the second insulating material 203 is different in material from the nitride material 202. In addition, suitable examples for the first and second insulating materials 201, 203 and the nitride material 202 are in accordance with the suitable materials described above for the first, second, and third insulating layers 36, 371, 372 and the first, second, and third insulator layers 421, 422, 423.

It should be noted that the depth of the electrode trenches and the termination trench and the thickness of the first and second insulating materials 201, 203 and the nitride material 202 may vary with the desired voltage withstanding capability of the trench power transistor. Since suitable insulating materials (for example, high dielectric insulating materials suitable for semiconductors such as $Si_3N_4$, $Al_2O_3$, $Y_2O_3$, $TiO_2$, $HfO_2$, $ZrO_2$, and so forth, or $SiO_2$) and correlation of the trench depth and insulating material thickness with the voltage withstanding capability of the trench power transistor are known in the art, detailed description thereof is omitted herein for the sake of brevity.

In this embodiment, the depth of the electrode trenches and the termination trench ranges from about 1 μm to about 10 μm, the thickness of the first insulating material 201 is about 160 Å to about 1000 Å, the thickness of the nitride material 202 ranges from about 250 Å to about 500 Å, and the thickness of the second insulating material 203 ranges from about 600 Å to about 12000 Å.

Figure 4:
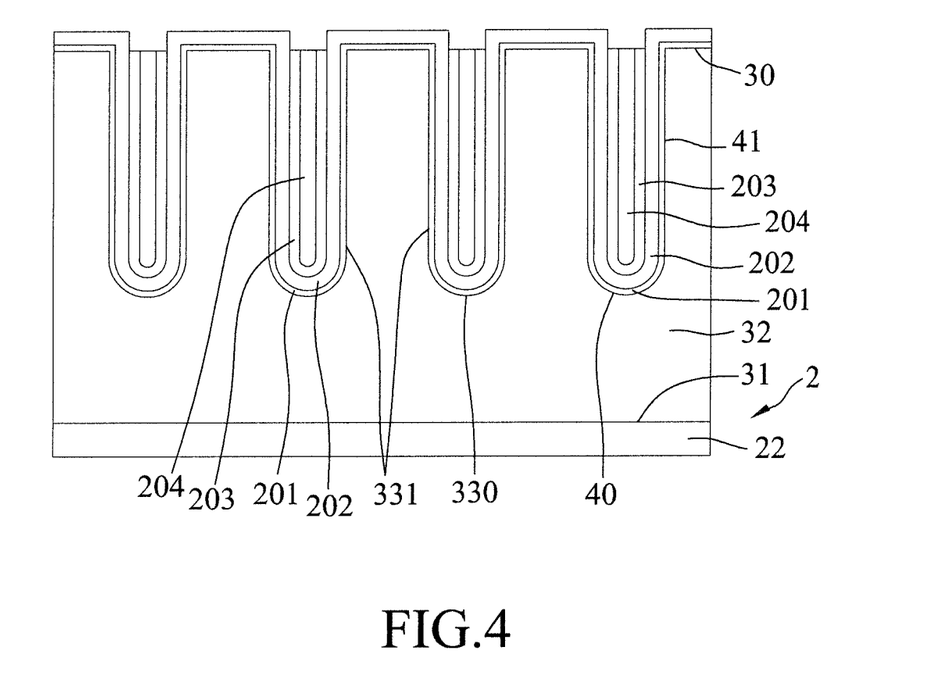
FIG. 4 is a schematic sectional view illustrating a structure formed after steps 91 to 93 of the embodiment of the method are conducted.

In step 93, a polycrystalline silicon material 204 is disposed (e.g. deposited) in each of the electrode trenches and the termination trench to be surrounded by the second insulating material 203, and the second insulating material 203 is partially etched so that the second insulating material 203 is retained in each of the electrode trenches and the termination trench (please note that before the partial etching process is conducted, the second insulating material 203 overlays the nitride material 202 outside the electrode trenches and the termination trench). The polycrystalline silicon material 204 is intended to form the shield electrode 38 and the electrically conductive member 43. After steps 91 to 93 are conducted, a structure shown in FIG. 4 is obtained. Particularly, the electrically conductive members 43 as shown in FIG. 2 are formed.

Figure 5:
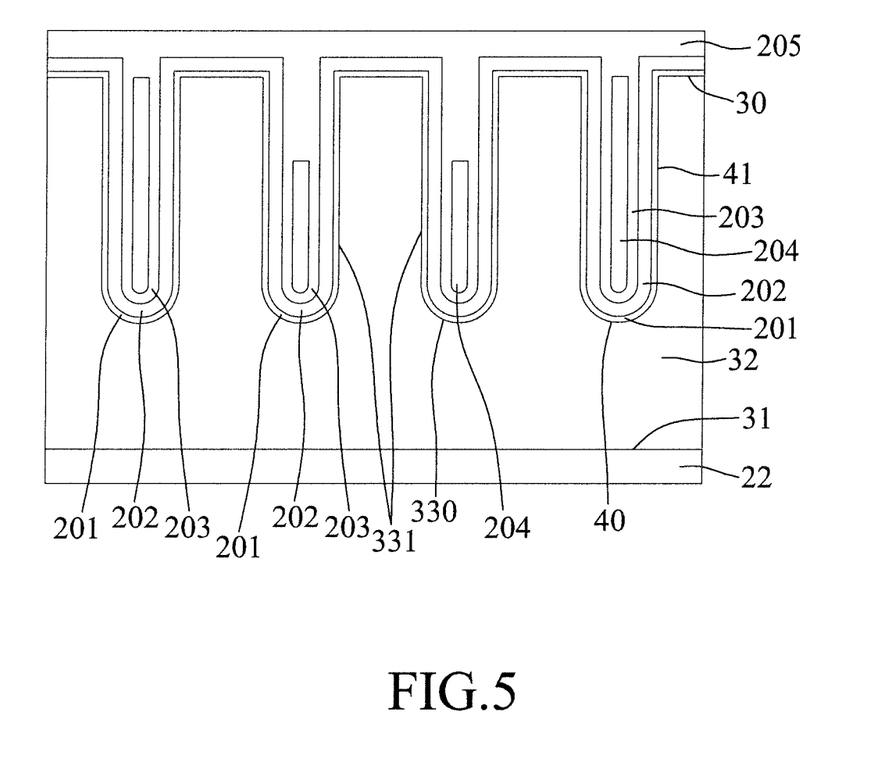
FIG. 5 is a schematic sectional view illustrating a structure formed after step 94 of the embodiment of the method is conducted.

In step 94, the polycrystalline silicon material 204 and the second insulating material 203 in each of the electrode trenches are partially etched, and a third insulating material 205 is disposed to cover the nitride material 202, the second insulating material 203, and the polycrystalline silicon material 204. Specifically, a mask is used to protect the polycrystalline silicon material 204 and the second insulating material 203 in the termination trench during the aforesaid partial etching process. In this embodiment, after the aforesaid partial etching process, about 0.4 µm to about 1.5 µm of the polycrystalline silicon material 204 in each of the electrode trenches is removed, and a height of the polycrystalline silicon material 204 in each of the electrode trenches is not larger than half of the depth of the electrode trenches. After the aforesaid partial etching process, the mask is removed, and the third insulating material 205 is formed through thermal oxidation and low-pressure chemical vapor deposition. After step 94 is conducted, a structure shown in FIG. 5 is obtained. Particularly, the shield electrodes 38 are formed.

Figure 6:
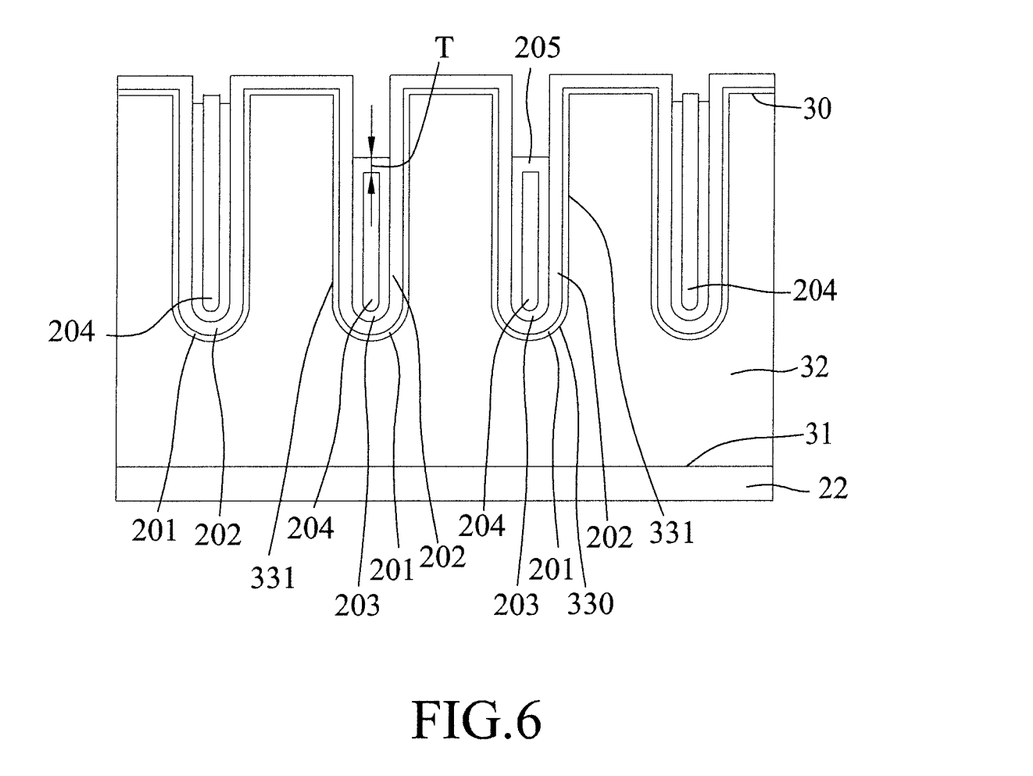
FIG. 6 is a schematic sectional view illustrating a structure formed after step 95 of the embodiment of the method is conducted.

In step 95, the third insulating material 205 is partially etched so that the nitride material 202 is partially exposed, so that a remaining portion of the third insulating material 205 in each of the electrode trenches has the predetermined thickness (T) to cooperate with the second insulating material 203 for enclosing the polycrystalline silicon material 204 in a corresponding one of the electrode trenches, and so that the polycrystalline silicon material 204 and the second insulating material 203 in the termination trench are partially exposed. In addition to the partial etching of the third insulating material 205, the second insulating material 203 in the termination trench is partially etched to be lower in height than the polycrystalline silicon material 204 in the termination trench. The thickness (T) of the third insulating material 205 may be modified when needed, and is in accordance with the description above for the third insulating layer 372. After step 95 is conducted, a structure shown in FIG. 6 is obtained.

Figure 7:
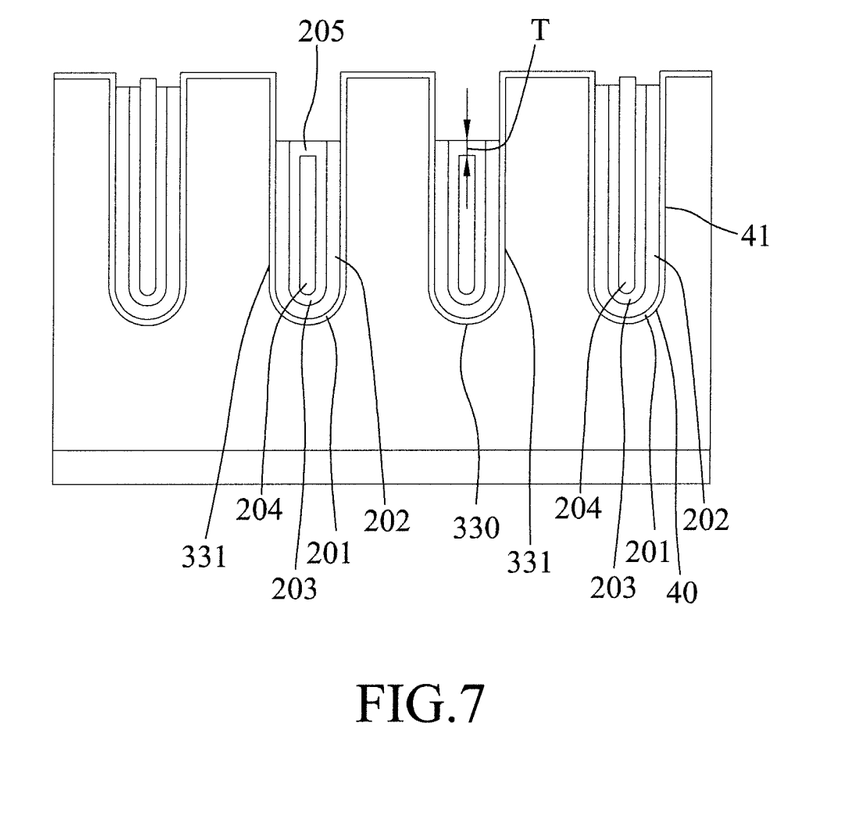
FIG. 7 is a schematic sectional view illustrating a structure formed after step 96 of the embodiment of the method is conducted.

In step 96, an exposed portion of the nitride material 202 is etched so that a portion of the first insulating material 201 covered by the exposed portion of the nitride material 202 is exposed, so that a remaining portion of the nitride material 202 surrounds the remaining portion of the third insulating material 205 and the second insulating material 203 in each of the electrode trenches, and so that the remaining portion of the nitride material 202 surrounds the second insulating material 203 in the termination trench. After step 96 is conducted, a structure shown in FIG. 7 is obtained. Particularly, the first, second, and third insulating layers 36, 371, 372 of each of the trench electrode structures 33, and the first, second, and third insulator layers 421, 422, 423 of the trench edge termination structure 4 as shown in FIG. 2 are formed.

In step 97, through a low-pressure chemical vapor deposition process conducted at a temperature ranging from 650° C. to 750° C., a fourth insulating material 206 is disposed on an exposed portion of the first insulating material 201, on the remaining portion of the third insulating material 205 and the remaining portion of the nitride material 202 in each of the electrode trenches, and on the polycrystalline silicon material 204, the second insulating material 203, and the remaining portion of the nitride material 202 in the termination trench. The fourth insulating material 206 is intended to form the fourth insulating layer 373 and the fourth insulator layer 424. Specifically, the low-pressure chemical vapor deposition process is conducted using tetraethyl orthosilicate (TEOS) as a reaction gas.

In compliance with the description above, the fourth insulating material 206 is different in material from the nitride material 202. In addition, suitable examples and thicknesses for the fourth insulating material 206 are in accordance with the suitable materials and thicknesses described above for the fourth insulating layer 373 and the fourth insulator layer 424.

Figure 8:
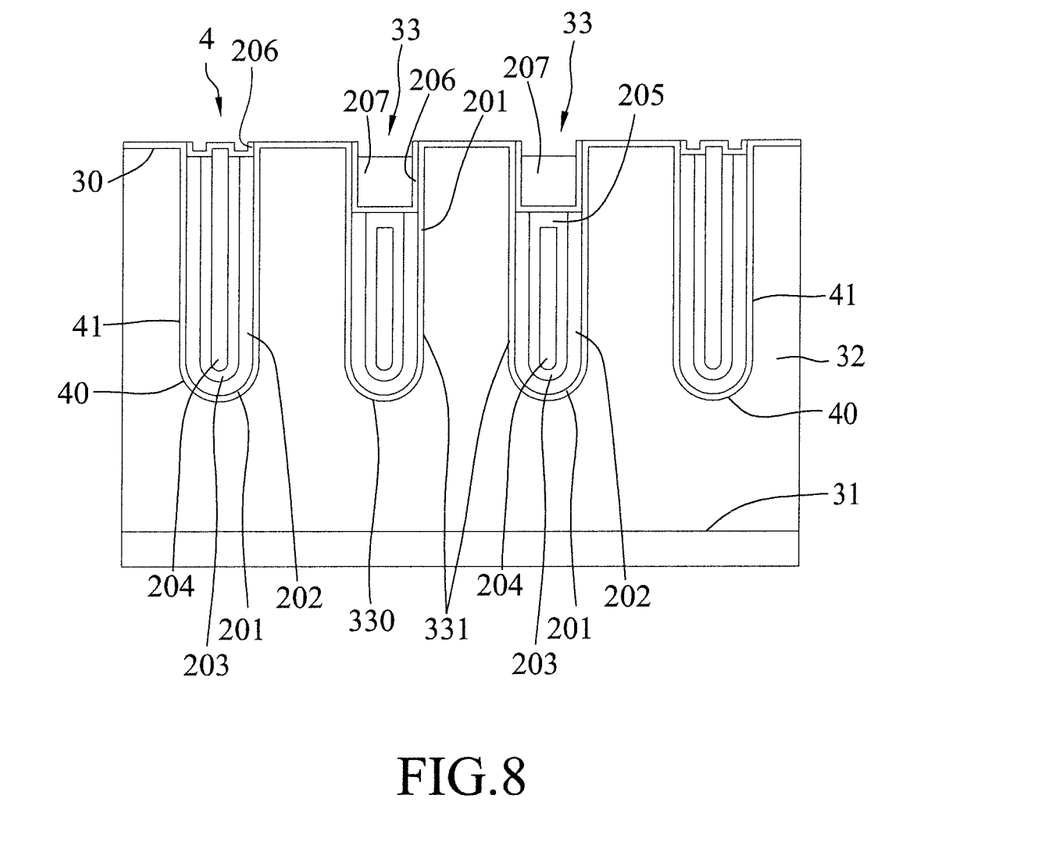
FIG. 8 is a schematic sectional view illustrating a structure formed after steps 97 to 98 of the embodiment of the method are conducted.

In step 98, another polycrystalline silicon material 207 is disposed (e.g. deposited) in each of the electrode trenches and on a portion of the fourth insulating material 206 that is not disposed on a portion of the first insulating material 201 covering the first surface 30, and a portion of the fourth insulating material 206 that is disposed on the portion of the first insulating material 201 covering the first surface 30 is etched. The another polycrystalline silicon material 207 is intended to form the gate electrode 39. After step 98 is conducted, a structure shown in FIG. 8 is obtained. Particularly, the trench electrode structures 33 and the trench edge termination structure 4 are formed.

In step 99, through ion implantation, the wells 34 are formed adjacent to the upper portions of the electrode trenches, and the sources 35 are respectively formed in the wells 34. After step 99 is conducted, the active regions 3A as shown in FIG. 2 are formed (i.e. the semiconductor body 3 as shown in FIG. 2 is formed). Furthermore, the insulation layer 5 is formed to cover the first surface 30, the electrode trenches, and the termination trench of the semiconductor body 3, and the electrically conducting unit 6 is formed on the insulation layer 5. Specifically, through-holes are formed to extend through the insulation layer 5 so as to respectively correspond in position to the sources 35, the gate electrodes 39 in the electrode trenches, and the electrically conductive member 43 in the termination trench, and ion implantation and metal deposition are sequentially conducted on the semiconductor body 3 via the through-holes, so that the source conducting plugs 61, the gate electrode conducting plugs, and the edge termination conducting plugs 62 are formed. In addition, the drain electrode 21 and the electrically conducting layer 63 are formed. After step 99 is conducted, the trench power transistor as shown in FIG. 2 is obtained.

The advantages of the method of the present disclosure are described as follows.

Referring back to FIG. 1, the conventional trench power transistor having the shield electrode (i.e. the trench-based source electrode 128a), for possessing better characteristics, is required to have less interface trap charges and dielectric trap charges in the insulating region 125a or between the insulating region 125a and the trench-based source electrode 128a. Furthermore, the insulating region 125a, which is between the gate electrode 127 and the trench-based source electrode 128*a*, is required to have a high quality and a sufficient thickness to withstand the electrical potential difference between the gate electrode 127 and the trench-based source electrode 128*a* during the operation.

However, in order to form the insulating region 125*a* having a sufficient thickness to separate the gate electrode 127 and the trench-based source electrode 128*a*, normally thermal oxidation is repeated multiple times to forma thick silicon oxide insulating layer. Since thermal oxidation is conducted at a high temperature (ranging from 950° C. to 1150° C.), the top portion of each of the trenches is undesiredly enlarged due to oxidation upon multiple repetitions of thermal oxidation. Thus, the mesa between the adjacent two trenches is reduced. As a result, conducting plugs will be inevitably formed too close to each other. Further, the threshold voltage ($V_{th}$) of the trench power transistor will be adversely affected, thereby increasing the uncertainty of the production method and reducing the favorableness in producing precision components.

In contrast, the method of the present disclosure applies low-pressure chemical vapor deposition at a temperature not higher than 750° C. to form an oxide insulating layer (i.e. the fourth insulating layer 373) between the shield electrode 38 and the gate electrode 39. The mesa between the adjacent two electrode trenches can be prevented from being reduced. Moreover, such oxide insulating layer can prevent the gate electrode 39 from contacting the nitride material (i.e. the second insulating layer 371).

Referring back to FIG. 9, when the second embodiment of the trench power transistor shown therein is intended to be produced, a second embodiment of the method according to the present disclosure is used. The second embodiment of the method is similar to the first embodiment, except that the rectifier structure 7 is formed between the adjacent electrode trenches to replace the well 34 and the source 35 between the adjacent electrode trenches. Specifically, in step 99, the Schottky conductive plug of the rectifier structure 7 is formed via a through-hole extending through the insulation layer 5 by virtue of metal deposition.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A trench power transistor comprising:
a semiconductor body having a first surface and a second surface opposite to each other, and including at least one active region, said active region including
a trench electrode structure having an electrode trench that is recessed from said first surface, and that has a bottom wall and a surrounding wall extending downwardly from said first surface to said bottom wall, said electrode trench having a lower portion that is defined by said bottom wall and a lower part of said surrounding wall extending upwardly from said bottom wall, and an upper portion that is defined by an upper part of said surrounding wall extending upwardly from said lower part of said surrounding wall to said first surface, said trench electrode structure including a first insulating layer that is disposed over said bottom wall and said upper and lower parts of said surrounding wall, and that has a first upper end proximal to said first surface, a second insulating layer that is disposed over a lower part of said first insulating layer overlaying said bottom wall and said lower part of said surrounding wall, that has a second upper end proximal to said upper portion of said electrode trench, and that is made of a nitride material, a third insulating layer that is disposed over said second insulating layer, that has a third upper end proximal to said upper portion of said electrode trench, and that is made of a material different from that of said second insulating layer, a shield electrode that is enclosed by said third insulating layer, a fourth insulating layer that is made of a material different from that of said second insulating layer, that is disposed in said upper portion of said electrode trench, and that is disposed on said third upper end of said third insulating layer, said second upper end of said second insulating layer, and a top part of said first insulating layer overlaying said upper part of said surrounding wall, and a gate electrode that is disposed on and surrounded by said fourth insulating layer,
a well formed adjacent to said electrode trench of said trench electrode structure, and extending downwardly from said first surface, and
a source formed in said well.

2. The trench power transistor as claimed in claim 1, wherein each of said third and fourth insulating layers is made from an oxide material.

3. The trench power transistor as claimed in claim 1, wherein said first insulating layer is made of an oxide material.

4. The trench power transistor as claimed in claim 1, further comprising an insulation layer that covers said first surface and said electrode trench of said semiconductor body, and an electrically conducting unit that is disposed on said insulation layer, said electrically conducting unit including a source conducting plug that is in ohmic contact with said source of said active region, and a gate electrode conducting plug that is in ohmic contact with said gate electrode of said trench electrode structure.

5. The trench power transistor as claimed in claim 1, wherein said semiconductor body further includes a trench edge termination structure surrounding said active region and having a termination trench that is recessed from said first surface and that has a bottom wall and a surrounding wall extending downwardly from said first surface to said bottom wall, said trench edge termination structure including a first insulator layer that is disposed over said bottom wall and said surrounding wall of said termination trench, and that has a first lower end formed over said bottom wall of said termination trench, a second insulator layer that is disposed over said first insulator layer and that has a second lower end formed over said first lower end of said first insulator layer, a third insulator layer that is disposed over said second insulator layer and that has a third lower end formed over said second lower end of said second insulator layer, and an electrically conductive member that is surrounded by said third insulator layer, that extends upwardly from said third lower end of said third insulator layer, and that has a height not less than half of a depth of said termination trench.

6. The trench power transistor as claimed in claim 5, wherein said second and third insulator layers are made from different materials.

7. The trench power transistor as claimed in claim 6, wherein each of said first and third insulator layers is made of an oxide material, and said second insulator layer is made of a nitride material.

8. The trench power transistor as claimed in claim 5, wherein said trench edge termination structure further includes a fourth insulator layer disposed over a first upper end of said first insulator layer proximal to said first surface, a second upper end of said second insulator layer proximal to said first surface, a third upper end of said third insulator layer proximal to said first surface, and a top part of said electrically conductive member 43 proximal to said first surface.

9. The trench power transistor as claimed in claim 5, further comprising an insulation layer that covers said first surface, said electrode trench, and said termination trench of said semiconductor body, and an electrically conducting unit that is disposed on said insulation layer, said electrically conducting unit including a source conducting plug that is in ohmic contact with said source of said trench electrode structure, a gate electrode conducting plug that is in ohmic contact with said gate electrode of said trench electrode structure, and an edge termination conducting plug that is in ohmic contact with said electrically conductive member of said trench edge termination structure.

10. The trench power transistor as claimed in claim 1, wherein said semiconductor body including a plurality of said active regions, said semiconductor body further including at least one rectifier structure that is disposed between two adjacent ones of said active regions, said rectifier structure including a Schottky conductive plug that is in Schottky contact with said semiconductor body.

11. A method for producing a trench power transistor, comprising the steps of:
(a) providing a semiconductor substrate having a first surface and a second surface opposite to each other, and at least one electrode trench that is recessed from the first surface, and that has a bottom wall and a surrounding wall extending downwardly from the first surface to the bottom wall;
(b) depositing a first insulating material over the first surface and the bottom wall and the surrounding wall of the electrode trench, depositing a nitride material over the first insulating material, and depositing a second insulating material over the nitride material, the second insulating material being different in material from the nitride material;
(c) disposing a polycrystalline silicon material in the electrode trench to be surrounded by the second insulating material, and partially etching the second insulating material so that the second insulating material is retained in the electrode trench;
(d) partially etching the polycrystalline silicon material, and disposing a third insulating material to cover the nitride material, the second insulating material, and the polycrystalline silicon material;
(e) partially etching the third insulating material so that the nitride material is partially exposed, and so that a remaining portion of the third insulating material in the electrode trench has a predetermined thickness to cooperate with the second insulating material for enclosing the polycrystalline silicon material;
(f) etching an exposed portion of the nitride material so that a portion of the first insulating material covered by the exposed portion of the nitride material is exposed, and so that a remaining portion of the nitride material surrounds the remaining portion of the third insulating material and the second insulating material;
(g) disposing, through a low-pressure chemical vapor deposition process conducted at a temperature ranging from 650° C. to 750° C., a fourth insulating material on an exposed portion of the first insulating material, and on the remaining portion of the third insulating material and the remaining portion of the nitride material in the electrode trench, the fourth insulating material being different in material from the nitride material;
(h) disposing another polycrystalline silicon material in the electrode trench and on a portion of the fourth insulating material that is not disposed on a portion of the first insulating material covering the first surface, and etching a portion of the fourth insulating material that is disposed on the portion of the first insulating material covering the first surface; and
(i) forming, through ion implantation, a well adjacent to the electrode trench and a source in the well, the well extending downwardly from the first surface.

12. The method as claimed in claim 11, wherein each of the second insulating material and the fourth insulating material is an oxide material.

13. The method as claimed in claim 11, wherein the first insulating material is an oxide material.

14. The method as claimed in claim 11, wherein in step (i), an insulation layer is formed to cover the first surface and the electrode trench of the semiconductor substrate, and an electrically conducting unit is formed on the insulation layer, the electrically conducting unit being in ohmic contact with the source and the another polycrystalline silicon material in the electrode trench.

15. The method as claimed in claim 11, wherein the semiconductor substrate provided in step (a) further has a termination trench that surrounds the electrode trench, that is recessed from the first surface, and that has a bottom wall and a surrounding wall extending downwardly from the first surface to the bottom wall, in step (b), the first insulating material being further deposited over the bottom wall and the surrounding wall of the termination trench, in step (c), the polycrystalline silicon material being further disposed in the termination trench to be surrounded by the second insulating material, and the second insulating material being partially etched so that the second insulating material is further retained in the termination trench, in step (e), the third insulating material being partially etched so that the polycrystalline silicon material and the second insulating material in the termination trench are partially exposed, in step (f), the exposed portion of the nitride material being etched so that a remaining portion of the nitride material surrounds the second insulating material in the termination trench, in step (g), the fourth insulating material being further disposed on the polycrystalline silicon material, the second insulating material, and the remaining portion of the nitride material in the termination trench, in step (h), the well and the source being formed to be surrounded by the termination trench.

16. The method as claimed in claim 15, wherein in step (i), an insulation layer is formed to cover the first surface, the electrode trench, and the termination trench of the semiconductor substrate, and an electrically conducting unit is formed on the insulation layer, the electrically conducting unit being in ohmic contact with the source, the another polycrystalline silicon material in the electrode trench, and the polycrystalline silicon material in the termination trench.

17. The method as claimed in claim 11, wherein the semiconductor substrate provided in step (a) has a plurality of the electrode trenches, in step (i), a rectifier structure being formed between two adjacent ones of the electrode trenches, the rectifier structure being in Schottky contact with the semiconductor substrate.

* * * * *